United States Patent
Huijsing et al.

(10) Patent No.: US 7,209,000 B2
(45) Date of Patent: Apr. 24, 2007

(54) FREQUENCY STABILIZATION OF CHOPPER-STABILIZED AMPLIFIERS

(75) Inventors: Johan Hendrik Huijsing, Schipluiden (NL); Maarten Jeroen Fonderie, Santa Clara, CA (US); Behzad Shahi, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 11/054,580

(22) Filed: Feb. 8, 2005

(65) Prior Publication Data

US 2006/0176108 A1   Aug. 10, 2006

(51) Int. Cl.
  *H03F 1/02*   (2006.01)
(52) U.S. Cl. ............................. 330/9; 330/107; 327/124
(58) Field of Classification Search .................... 330/9; 327/124, 307
  See application file for complete search history.

(56) References Cited

U.S. PATENT DOCUMENTS

| | | | |
|---|---|---|---|
| 3,007,116 A * | 10/1961 | Gerhard ........................ | 330/10 |
| 4,559,502 A | 12/1985 | Hiujsing | |
| 4,633,223 A * | 12/1986 | Senderowicz ................ | 341/118 |
| 5,486,790 A | 1/1996 | Huijsing et al. | |
| 6,456,159 B1 | 9/2002 | Brewer | |
| 6,559,720 B1 | 5/2003 | Huijsing et al. | |
| 6,611,171 B2 | 8/2003 | Kimura | |
| 6,734,723 B2 | 5/2004 | Huijsing et al. | |
| 7,038,501 B2 | 5/2006 | Lee et al. | |
| 7,132,883 B2 * | 11/2006 | Huijsing et al. ............... | 330/9 |
| 2003/0234689 A1 | 12/2003 | Leighton et al. | |
| 2006/0055456 A1 * | 3/2006 | Niederkorn ..................... | 330/9 |

OTHER PUBLICATIONS

Van Den Dool, Bernard J., et al., "Indirect Current Feedback Instrumentation Amplifier with a Common-Mode Input Range that Includes the Negative Rail", IEEE Journal of Solid-State Circuits, Jul. 1993, pp. 743-749, vol. 28, No. 7.

Huijsing, Johan H., "Operational Amplifiers Theory and Design", Mar. 2001, p. 408, Kluwer Academic Publishers.

Linear Technology Corporation, "LTC6800 Rail-to-Rail Input and Output, Instrumentation Amplifier", 2002, pp. 1-12.

* cited by examiner

*Primary Examiner*—Robert Pascal
*Assistant Examiner*—Alan Wong
(74) *Attorney, Agent, or Firm*—Blakely, Sokoloff, Taylor & Zafman LLP

(57) ABSTRACT

Frequency stabilization of chopper-stabilized amplifiers using multipath hybrid double-nested Miller compensation. The compensation may provide a desired 6 dB/oct roll off for both instrumentation amplifiers and operational amplifiers. Various embodiments are disclosed.

4 Claims, 11 Drawing Sheets

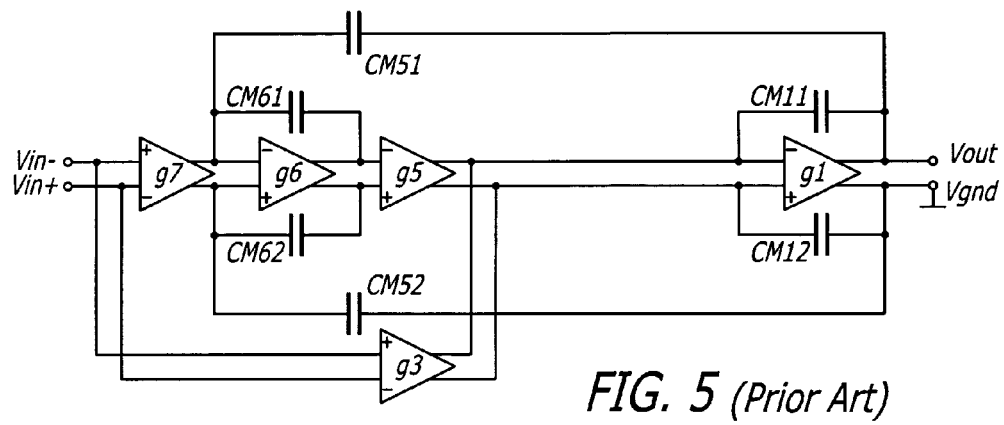
FIG. 5 *(Prior Art)*
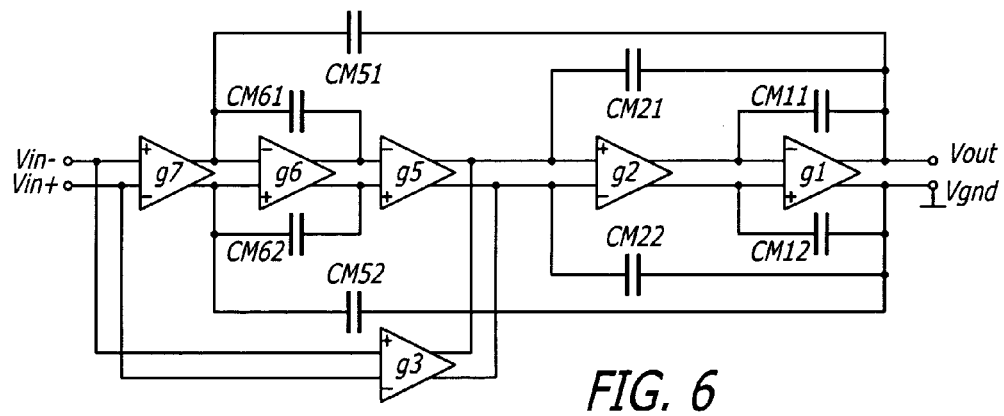
FIG. 6

FREQUENCY STABILIZATION OF CHOPPER-STABILIZED AMPLIFIERS

BACKGROUND OF THE INVENTION

1. Field of the Invention

The present invention relates to the field of chopper stabilized amplifiers.

2. Prior Art

Frequency compensation for precision OpAmps (operational amplifiers) has a large history. FIG. 1 illustrates the nested Miller compensation scheme of U.S. Pat. No. 4,559,502 for compensation of a 3-stage amplifier (multipath hybrid nested Miller compensation is shown in U.S. Pat. No. 5,486,790). The single output stage does not need frequency compensation. The compensation capacitors $C_{M11}$ and $C_{M12}$ compensate for the extra gain of amplifier $G_2$, while $C_{M21}$ and $C_{M22}$ compensate for the extra gain of amplifier $G_3$.

For obtaining a low offset, choppers can be placed around the input amplifier G3. This is shown in FIG. 2. The offset of amplifier $G_3$ will appear as a residual square wave at the output as fed back to the input of the amplifier. The average offset is nearly zero.

The chopper stage amplifier $G_3$ requires compensation capacitors $C_{M21}$ and $C_{M22}$ similar to the version without choppers of FIG. 1. The chopper amplifier of FIG. 2 has a frequency response corresponding to the lower amplitude characteristic of FIG. 13, but does not have chopper stabilization. The frequency response has a horizontal part with high gain at low frequencies, and a straight 6 dB/oct roll off at higher frequencies. This straight roll off is desired for providing stability with a large choice of gain settings by the feedback network. The slope of 6 dB/oct normally results in a phase margin of 90 degrees.

The situation changes with a chopper-stabilized OpAmp as in FIG. 3. Chopper stabilization is used to compensate for the offset of the OpAmp. A chopper $Ch_2$ is used to sense the offset of the OpAmp and convert this into a square wave. This square-wave signal is converted into a current by voltage to current converter $G_7$ and redirected into a DC current by chopper $Ch_4$. Next, the redirected current is fed into an integrator $G_6$ and then converted again in a current by voltage to current converter $G_5$ and subtracted from the output current of the offset producing input stage $G_3$, so that its offset gets compensated. The choppers and integrator are needed to reduce the influence of the offset of the sense amplifier $G_7$. This offset merely causes a small triangular voltage at the output of integrator $G_6$. A reduced triangular voltage residue is present at the input of the amplifier. The larger the ratio $\tau = C_{M61, 62}/GM_7$, where $GM_7$ is the transconductance of the voltage to current converter $G_7$, the smaller the triangular voltage.

The frequency characteristic of the chopper stabilized amplifier of FIG. 3 differs from that of FIG. 2 in that a bubble arises in the amplitude characteristic at low frequencies, as depicted in the upper curve of FIG. 13. The bubble is the result of the extra low-frequency gain caused by the multipath integrator $G_6$. From a certain frequency $f_3$ back to the lower frequency $f_1$, the multipath integrator $G_6$ has more gain than the main path, and its extra pole shows as a 12 dB/oct slope. From frequency $f_1$, where the gain of the main amplifier reaches its flat maximum, there is a 6 dB/oct roll off Back to frequency $f_2$. Finally, when at very low frequencies the leakage of the integration ends the integration function, the frequency characteristic becomes horizontal. If the amplifier is used in high-gain feedback settings, the 12 dB/oct part may cause undesired near-unstable behavior. Therefore, ways to straighten out this bubble are needed.

If the chopper chopper-stabilized architecture of FIG. 4 is used, (U.S. Pat. No. 6,734,723) there is the same frequency bubble as the circuit of FIG. 3. In FIG. 4, the chopper $Ch_2$ has two functions: firstly as input chopper for the main amplifier $G_3$ with output chopper $Ch_1$, and secondly, chopper $Ch_2$ converts the input offset of transconductance amplifier $G_3$ into a square wave referred to the input. Now the offset of amplifier $G_3$ can be sensed by transconductance amplifier $G_7$, independent of the offset of amplifier $G_7$, redirected by chopper $Ch_4$, and integrated by integrator $G_6$ and corrected for by $G_5$. This results in a similar bubble of the frequency characteristic as that of FIG. 4,: which is shown in FIG. 13. Therefore, there is a need to straighten the bubble out in this case also.

FIG. 5 illustrates a prior art multipath operational amplifier structure having four stages in the gain path. This gain path is hybrid nested compensated. This means that it has a backward nest $C_{M11}$ and $C_{M12}$ around amplifier $G_1$ at the output, and a forward nest $C_{M61}$ and $C_{M62}$ around amplifier $G_6$, both encompassed by an outward nest $C_{M51}$ and $C_{M52}$ around amplifier $G_5$. It also has a multipath amplifier $G_3$ in order to increase the bandwidth. This results in straight frequency roll off with 6 dB/oct if the dimensioning is done well.

BRIEF DESCRIPTION OF THE DRAWINGS

FIG. 5 illustrates a prior art multipath operational amplifier structure having four stages in the gain path.

FIG. 6 illustrates a multipath operational amplifier structure having five stages in the gain path with multipath hybrid double-nested Miller compensation.

DETAILED DESCRIPTION OF THE PREFERRED EMBODIMENTS

Description of Embodiments as Applied to OpAmps

To straighten out the bubble in the frequency response described before, chopper-stabilized methods may be combined with the prior art multipath hybrid nested Miller compensation in two steps.

The circuit of FIG. 5 may be extended with another amplifier $G_2$ in the gain path. To make it stable, a double nested structure is added at the output by $C_{M21}$ and $C_{M22}$. The result is the multipath hybrid double-nested Miller compensation structure of FIG. 6. It has the desired straight 6 dB/oct roll off of the frequency characteristic.

Figure 1:
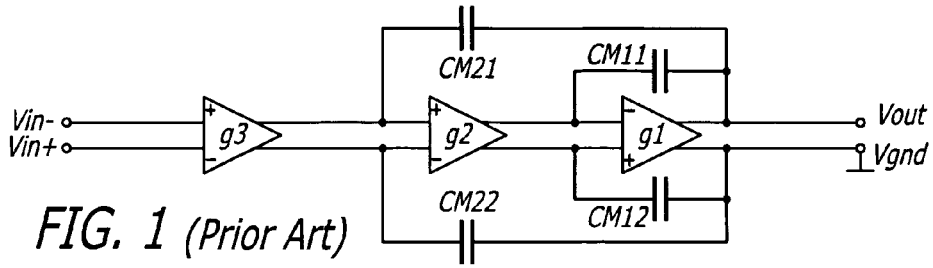
FIG. 1 illustrates the prior art nested Miller compensation scheme of U.S. Pat. No. 4,559,502 for compensation of a 3-stage operational amplifier.
Figure 2:
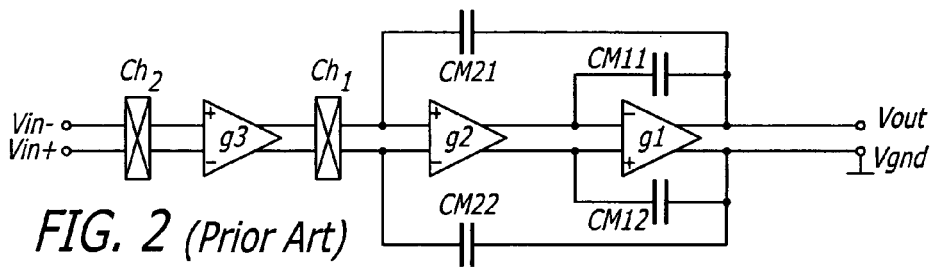
FIG. 2 illustrates the prior art amplifier of FIG. 1 with choppers placed around the input amplifier.
Figure 3:
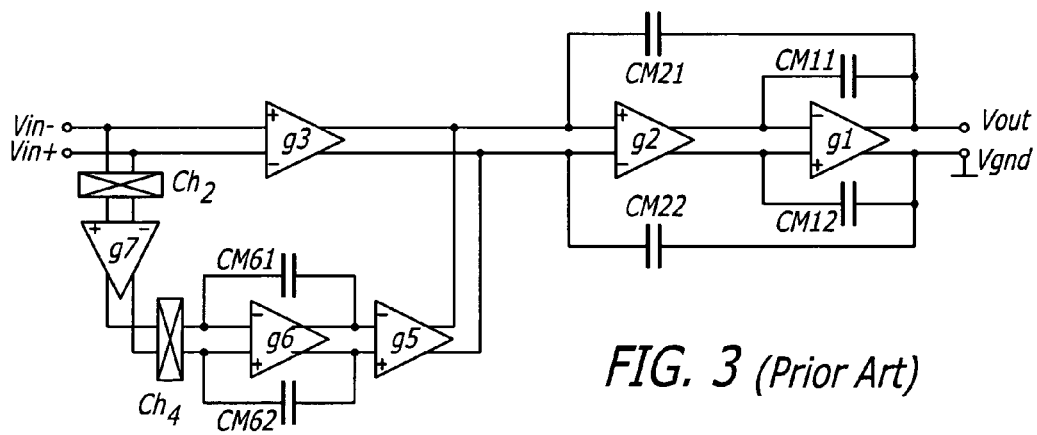
FIG. 3 illustrates another prior art chopper-stabilized operational amplifier.
Figure 4:
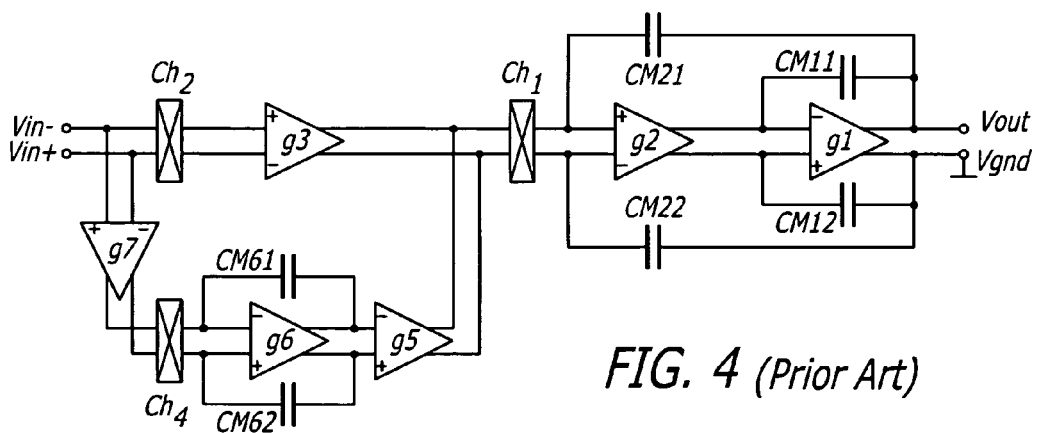
FIG. 4 illustrates a prior art chopper chopper-stabilized operational amplifier architecture.
Figure 7:
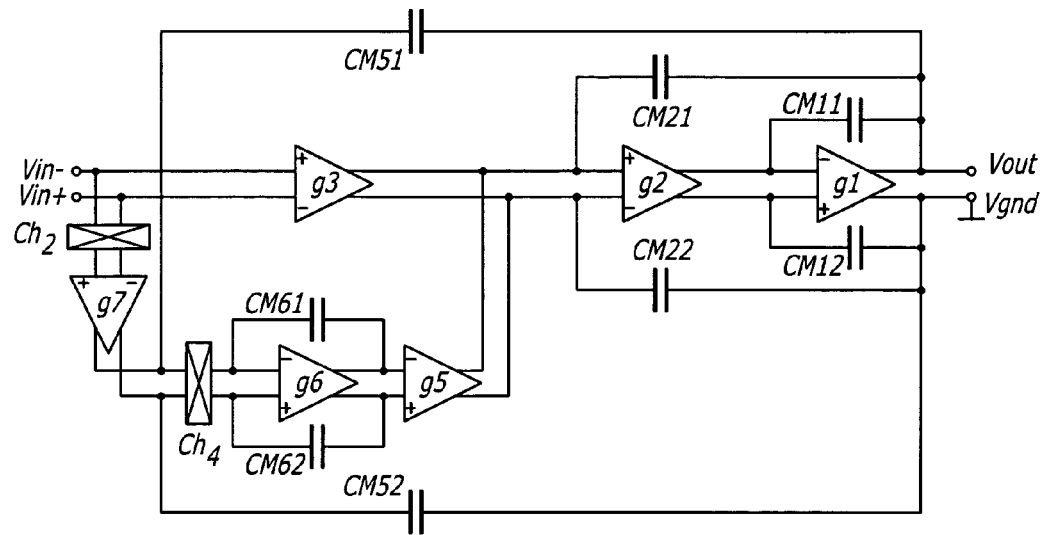
FIG. 7 illustrates the multipath operational amplifier structure of FIG. 6 with chopper-stabilization added.
Figure 14:
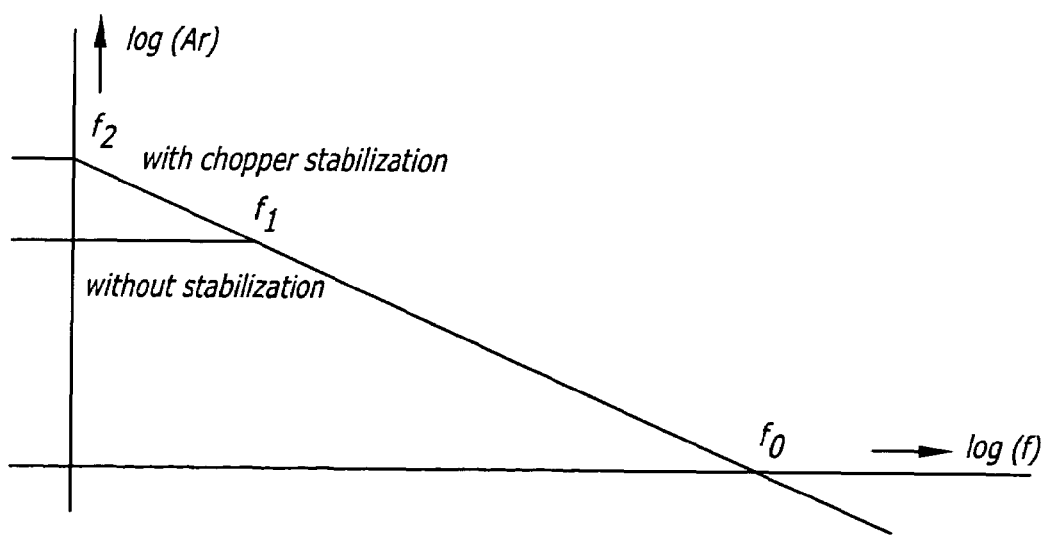
FIG. 14 presents curves illustrating a desired 6 dB/oct roll off in the frequency response of the amplifiers of FIGS. 7, 8, 10 and 12.
Figure 15:
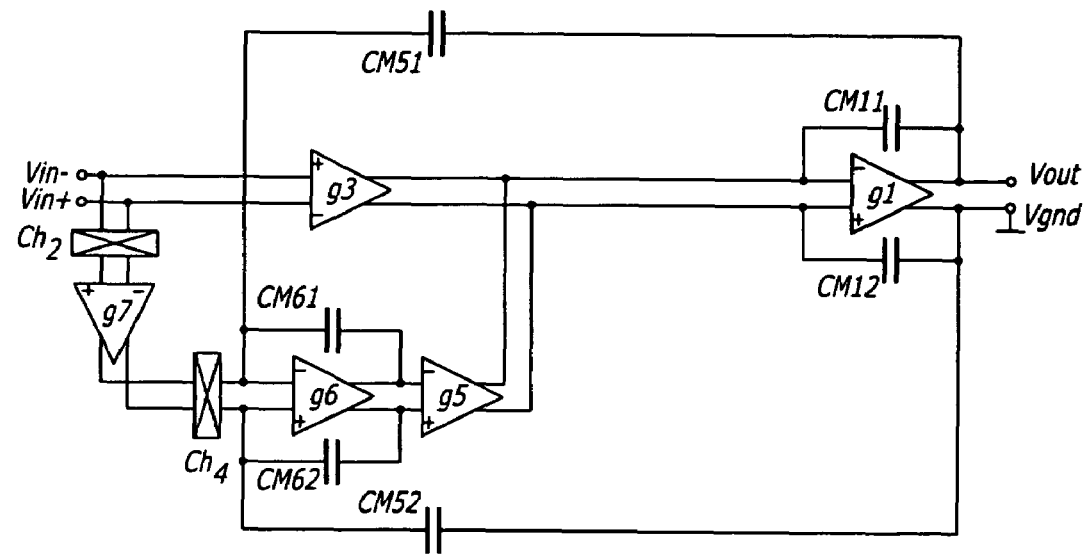
FIGS. 15 through 18 illustrate circuits similar to those of FIGS. 7, 8, 10 and 12 in, respectively, though dispensing with the use of amplifier $G_2$ and Miller compensation capacitors $CM_{21}$ and $CM_{22}$.
Figure 16:
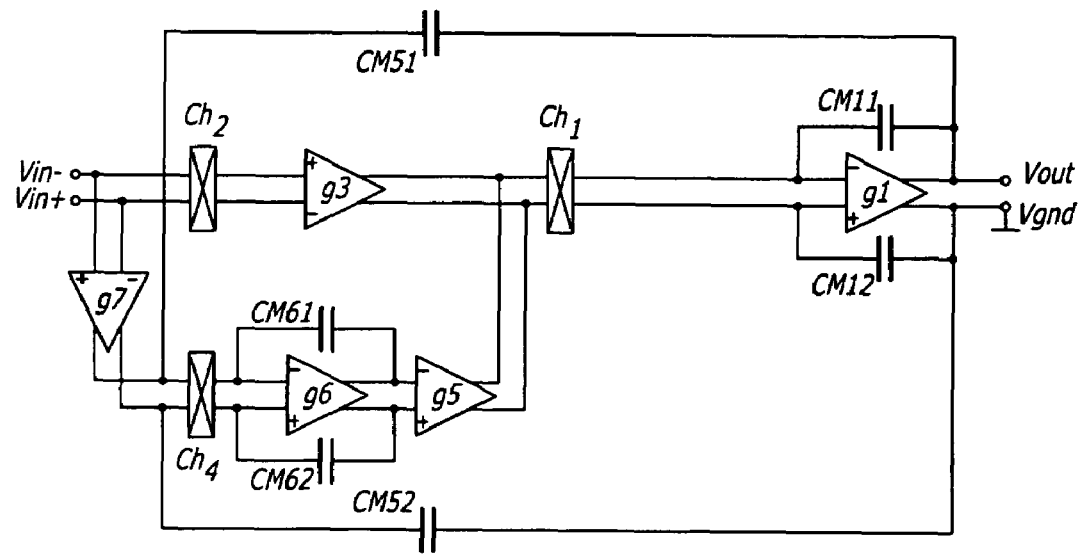
Figure 17:
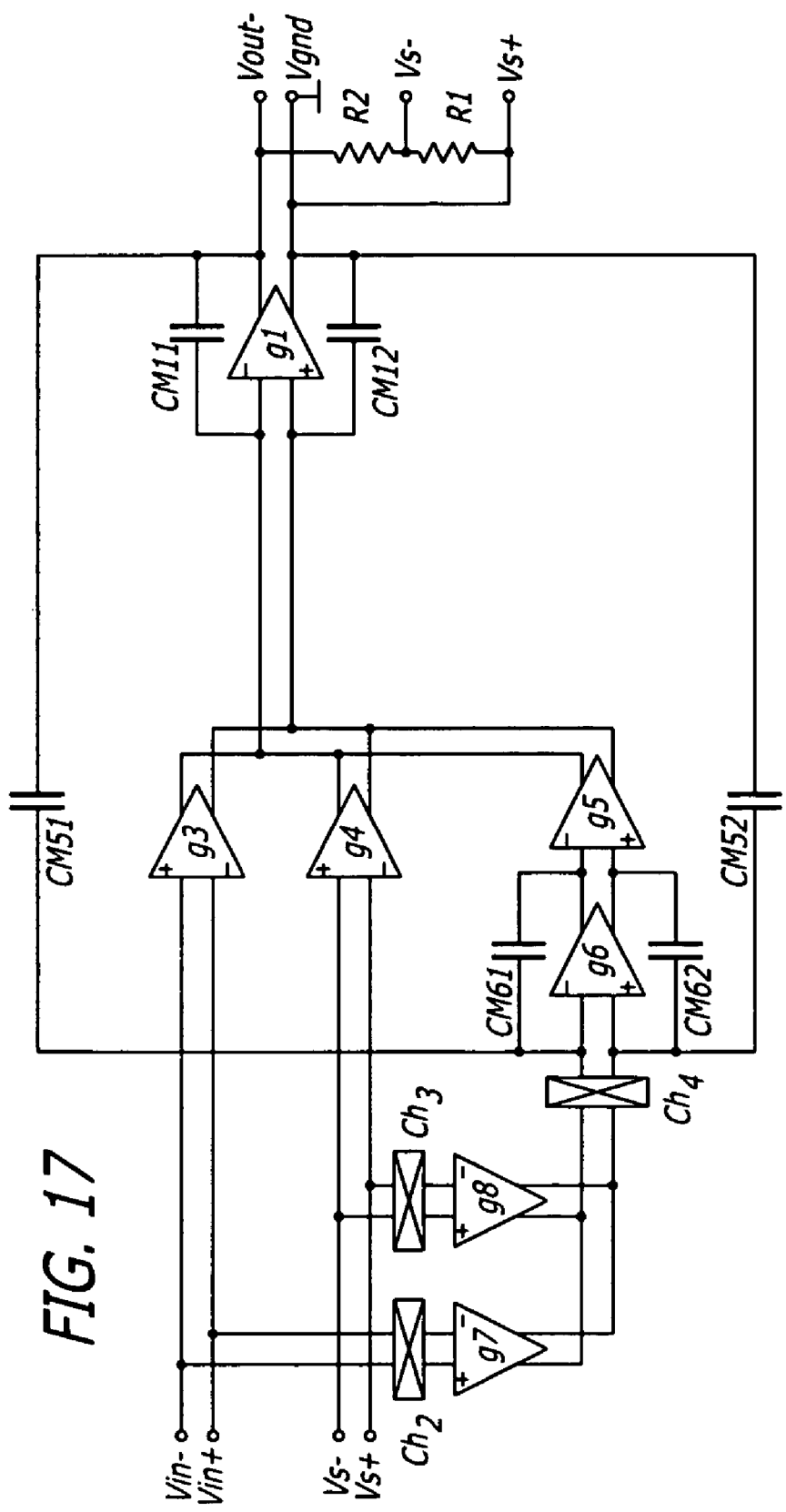
Figure 18:
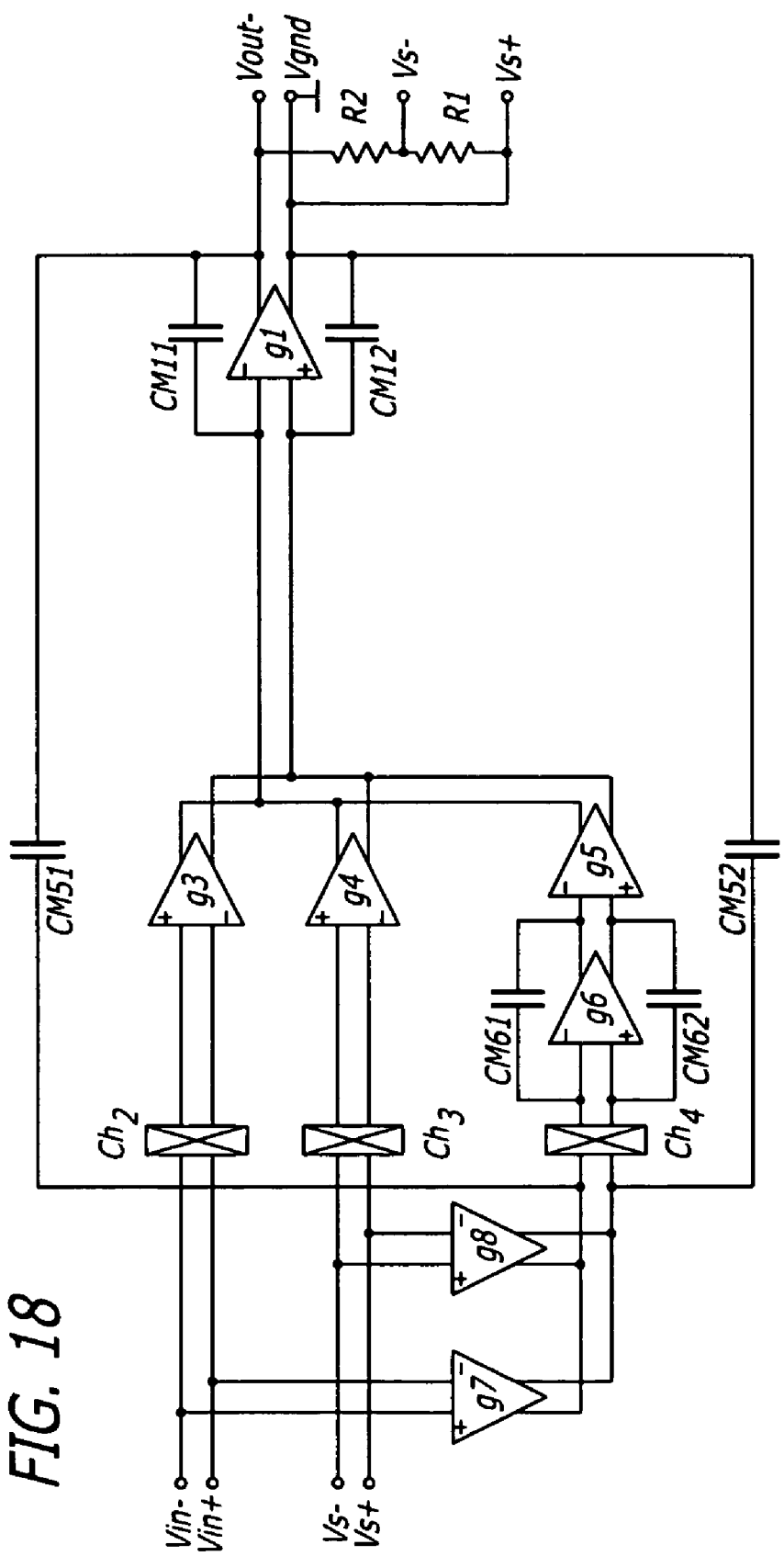
Figure 7:
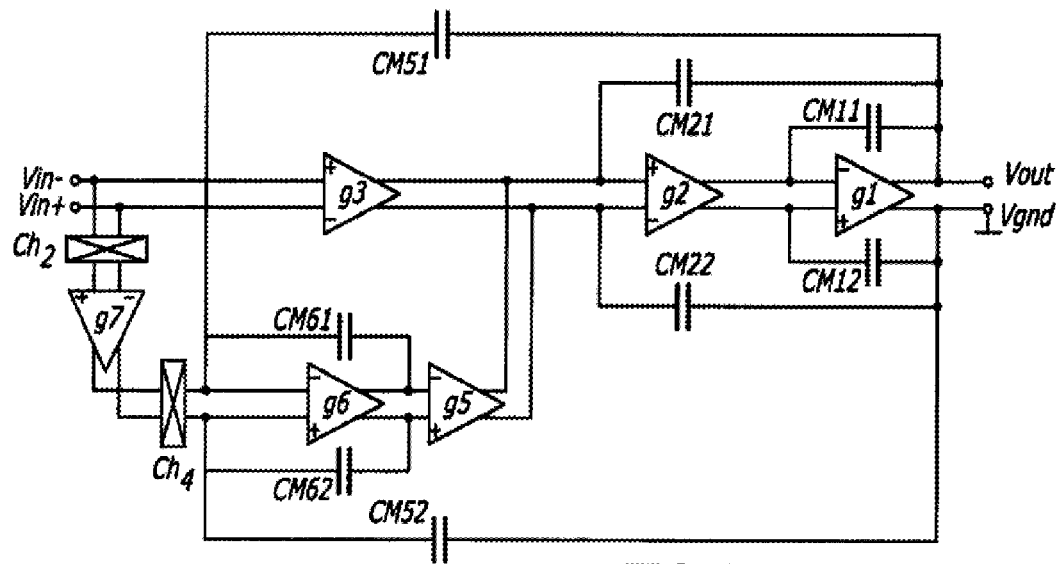
Figure 8:
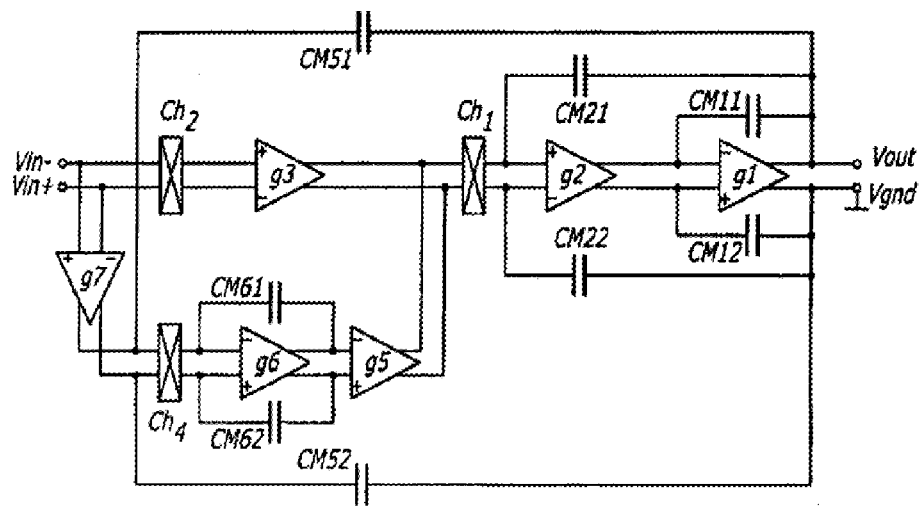
Figure 18:
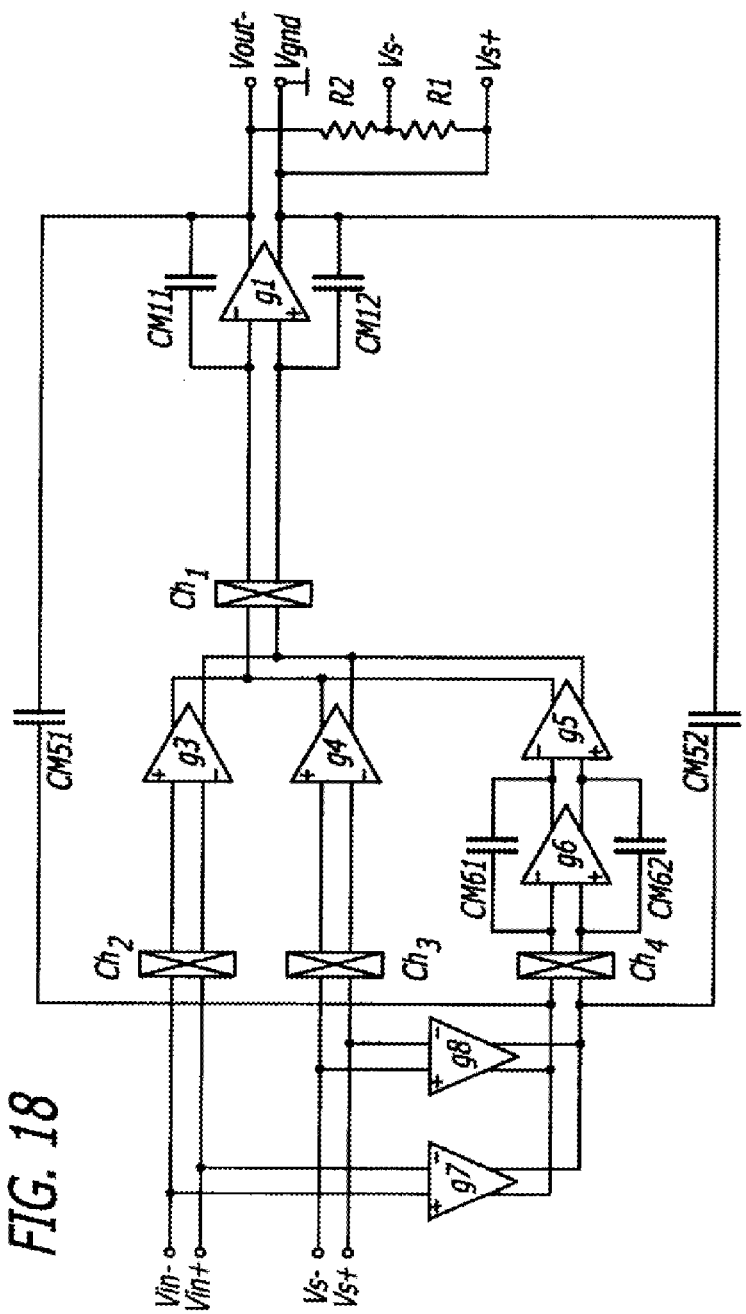

Now chopper-stabilization can be added in the amplifier of FIG. 6. This results in the chopper stabilized OpAmp with multipath hybrid double-nested Miller compensation of FIG. 7. The feed forward nested capacitors $C_{M61}$ and $C_{M62}$ can now be chosen to fit the requirements of an integrator of the signal from amplifier $G_7$ in the chopper-stabilized amplifier. At a right choice of all amplifier and capacitor values, the desired straight roll off of the frequency characteristic is obtained as shown in FIG. 14.

Figure 8:
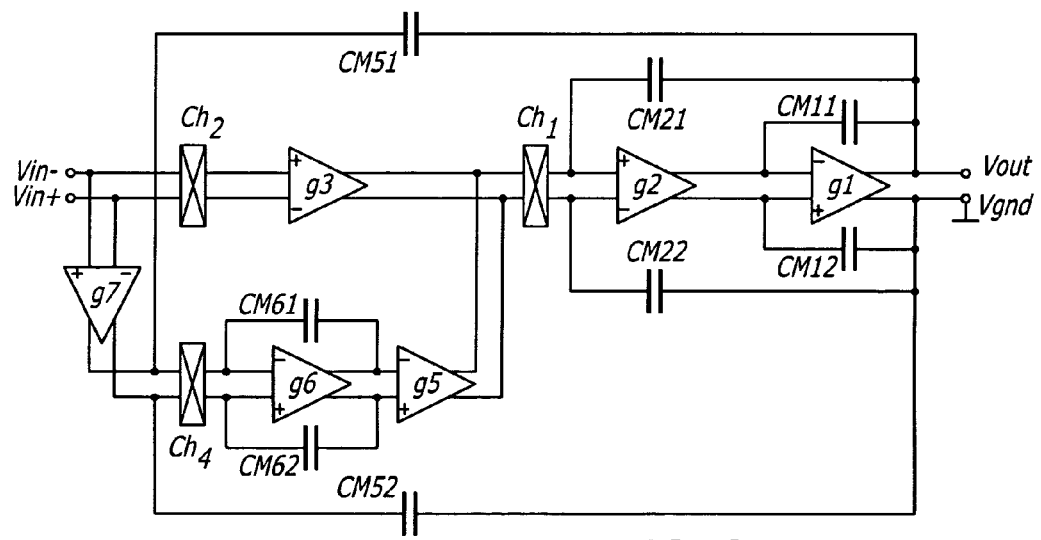
FIG. 8 illustrates a chopper chopper-stabilized amplifier with multipath hybrid double-nested Miller compensation.

As an alternate embodiment, the chopper chopper-stabilized amplifier may be combined with the multipath hybrid double-nested Miller compensation as shown in FIG. 8. This also provides the straight 6 dB roll off shown in FIG. 14. It is interesting to see how the choppers chop the amplifiers $G_3$, $G_6$, and $G_5$ completely including the integrator feed forward nest $C_{M61}$ and $C_{M62}$, without mixing up the outer nest $C_{M51}$ and $C_{M52}$ together with the double nest $C_{M11}$ and $C_{M12}$, $C_{M21}$ and $C_{M22}$ at the output. This is because the outer nest $C_{M51}$ and $C_{M52}$ are connected before chopper $Ch_4$, while in FIG. 7, this connection was behind chopper $Ch_4$.

Description of Embodiments for Instrumentation Amplifiers

The principles of this invention can also be applied to chopper-stabilized instrumentation amplifiers. This type of amplifier itself is the subject of a separate application for patent entitled "Chopper Chopper-Stabilized Instrumentation and Operational Amplifiers" filed on Feb. 8, 2005 as application Ser. No. 11/055123, the disclosure of which is hereby incorporated by reference.

Figure 9:
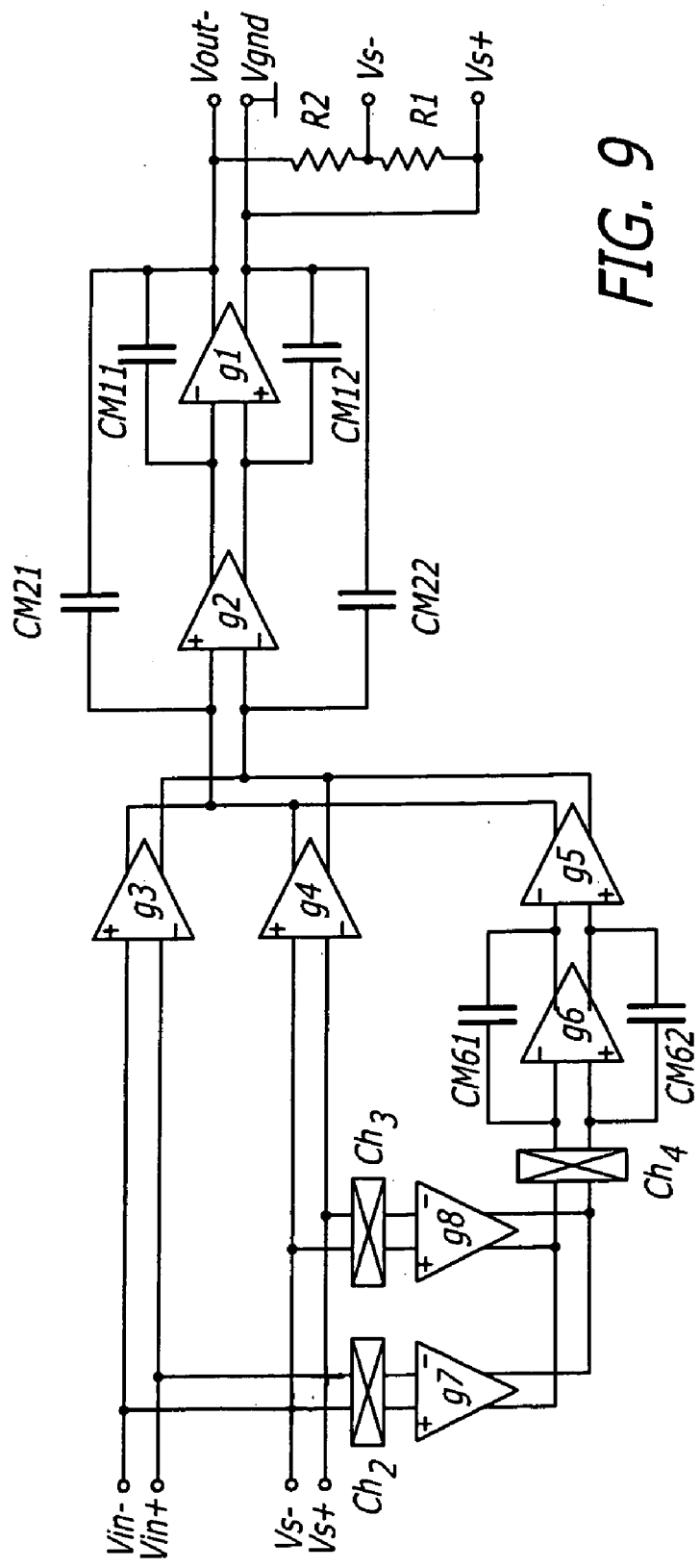
FIG. 9 illustrates a chopper-stabilized current-feedback instrumentation amplifier.
Figure 10:
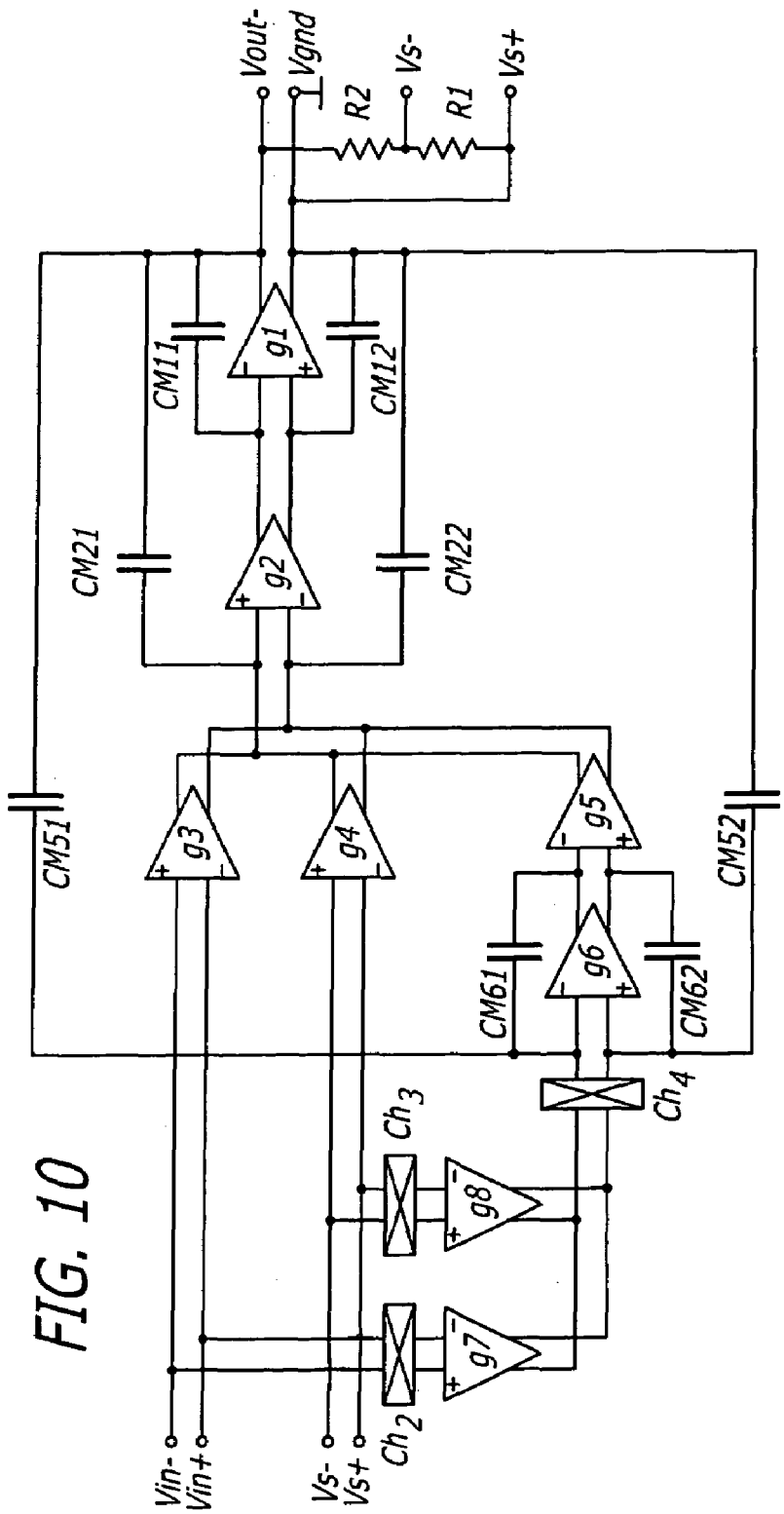
FIG. 10 illustrates the chopper-stabilized current-feedback instrumentation amplifier of FIG. 9 with multipath hybrid double-nested Miller compensation.

A chopper-stabilized current-feedback instrumentation amplifier in accordance with the above referenced application is shown in FIG. 9. Resistors R1 and R2 form an output attenuator for feedback of the attenuated voltage $V_{s+}$ and $V_{s-}$. The multipath hybrid double-nested Miller compensation structure can be combined with the amplifier of FIG. 9 by just adding $C_{M51}$ and $C_{M52}$ as shown in FIG. 10. It has the desired straight 6 dB/oct roll off, as shown in the upper part of FIG. 14.

Figure 11:
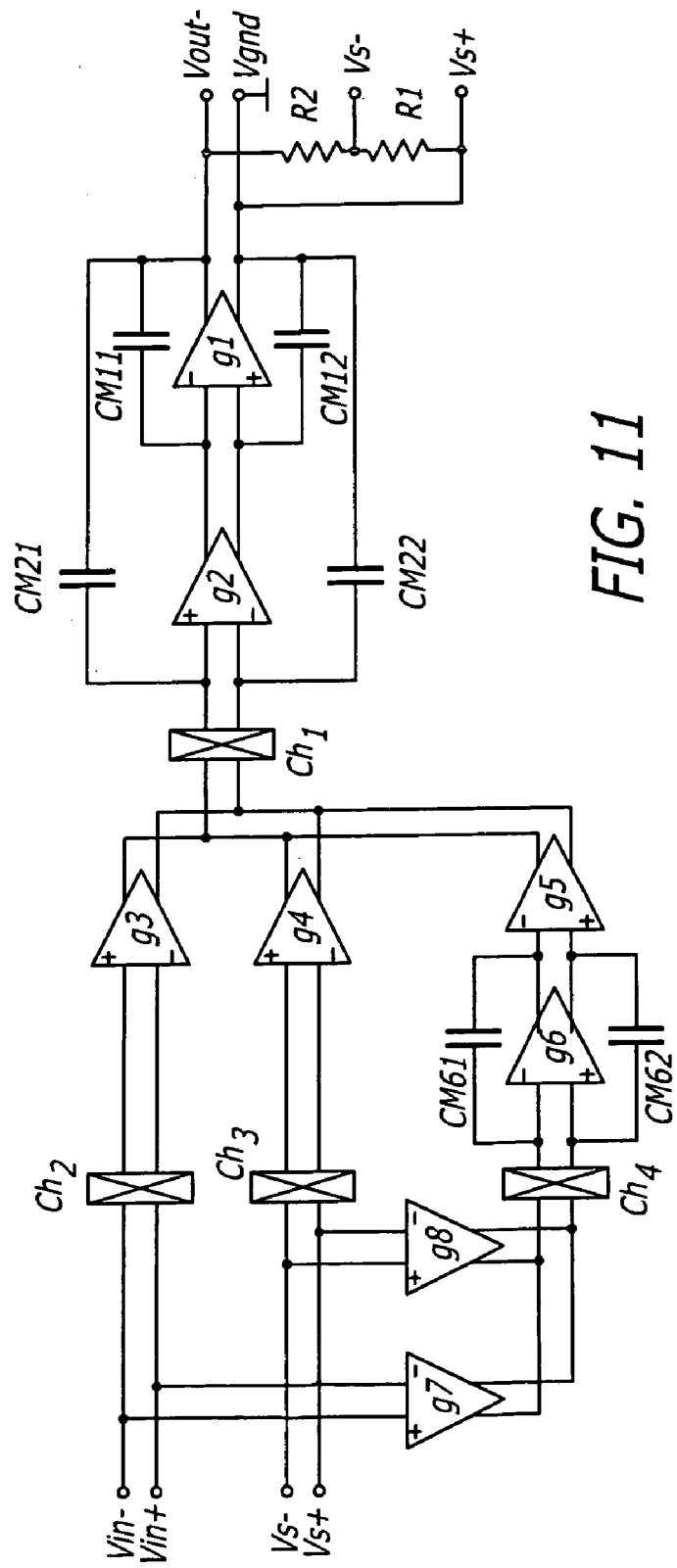
FIG. 11 illustrates a chopper chopper-stabilized current-feedback instrumentation amplifier.

Also the chopper chopper-stabilized current-feedback instrumentation amplifier of FIG. 11 is disclosed in the foregoing application. As disclosed therein, the voltage-to-current converter $G_3$ senses the input signal $V_{in} = V_{in+} - V_{in-}$, while the voltage-to-current converter $G_4$ takes the sense feedback output signal $V_s = V_{s+} - V_{s-}$. If $G_3 = G_4$, the high loop gain of the whole amplifier forces the feedback sense voltage $V_s$ to be equal and opposite to the input voltage $V_{in}$.

The choppers $Ch_1$ $Ch_2$ and $Ch_3$ chop the offset voltage of the amplifiers $G_3$ and $G_4$. The chopped offset can be regarded as a square-wave interference voltage referred to the input voltage of amplifiers $G_3$ and $G_4$. The input voltage $V_{in}$ is determined by an external source, and while generally may be a varying signal, it does not contain the square-wave signal. The high loop gain of the whole amplifier forces the feedback-sense voltage $V_s$ to compensate the chopped input offset voltage. Therefore, this square-wave chopped input offset will be superimposed on the desired feedback sense voltage $V_s$.

In the circuit of FIG. 11, amplifiers $G_7$ and $G_8$ (voltage to current converters or transconductance amplifiers) are used to obtain a gauge to control the offset of amplifiers $G_3$ and $G_4$. More specifically, with respect to DC levels, the closed loop circuit settles with $V_{in}$ and $V_s$ being equal and opposite voltages. However the sense voltage $V_s$ has the offset caused square wave on it while $V_{in}$ does not. Consequently the output current of amplifier $G_7$ plus the output current of amplifier $G_8$ will simply be the square wave caused by the offset of amplifier $G_3$. Thus the resulting current represents the square-wave chopped input offset voltage component from $V_s$, and largely suppresses the desired input and feedback sense voltages.

Next the combined output currents of amplifiers $G_7$ and $G_8$ are rectified into a DC current by the chopper $Ch_4$. This DC current represents the input offset voltage. Next this DC current is integrated by an integrator amplifier $G_6$, with the integrator output voltage being converted into a current by $G_5$ and added to the output currents of amplifiers $G_3$ and $G_4$ in order to gradually cancel the input offset voltage of these amplifiers. Since the offsets are at most very slowly varying, such as by temperature or time variations, in general the response of this offset control loop need not be particularly fast, and generally is intentionally given a time constant much longer than the chopper frequency period so as to be a substantially fixed offset compensation during each chopper period. Note that the integrator has the effect of integrating the rectified square wave on the sense voltage $V_s$, no matter how small, so that, neglecting other sources of error, the offset control loop settles when the offset is eliminated, and is not limited to the gain within the control loop.

Figure 12:
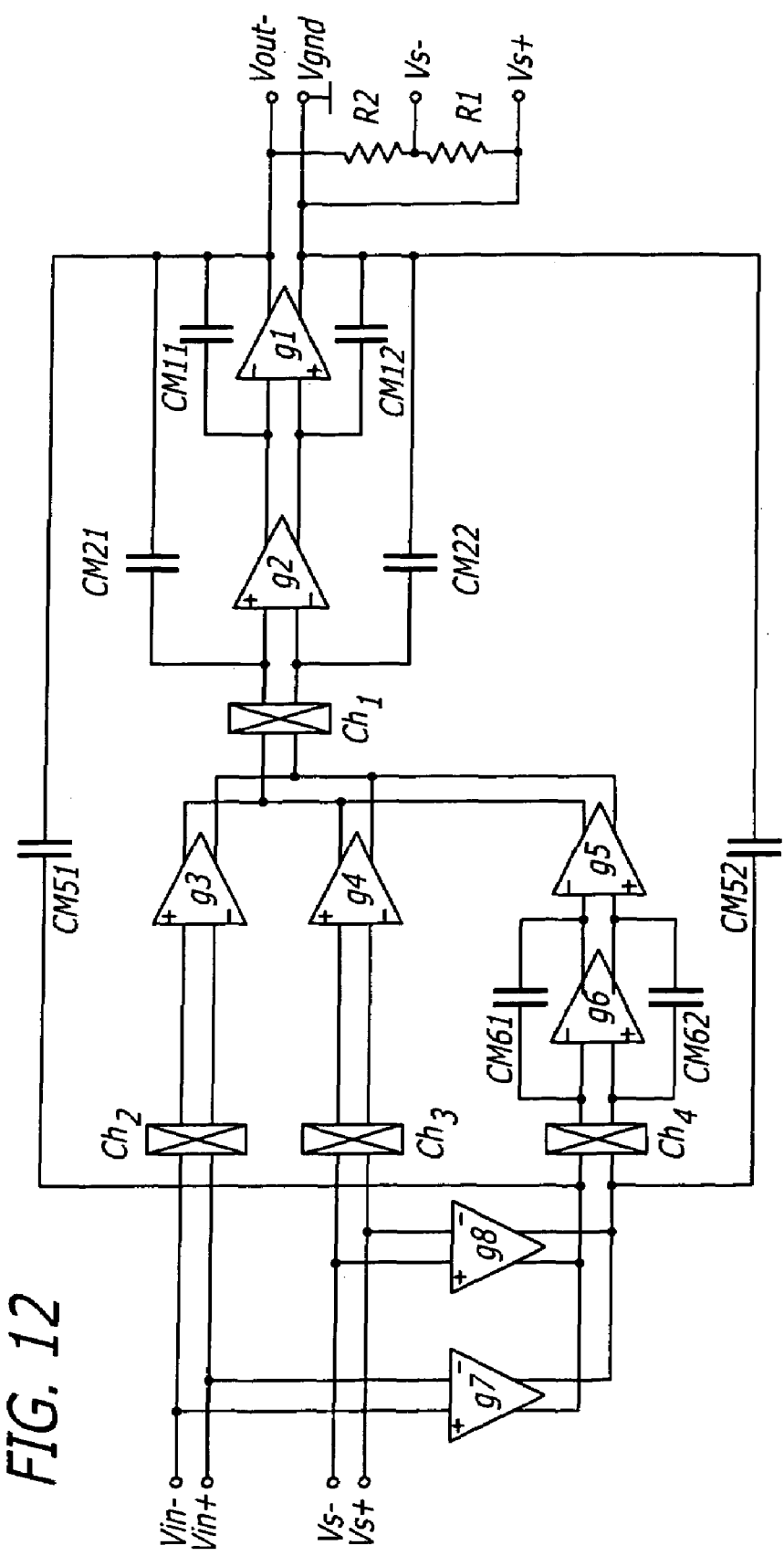
FIG. 12 illustrates the chopper chopper-stabilized current-feedback instrumentation amplifier of FIG. 11 with multipath hybrid double-nested Miller compensation added.
Figure 13:
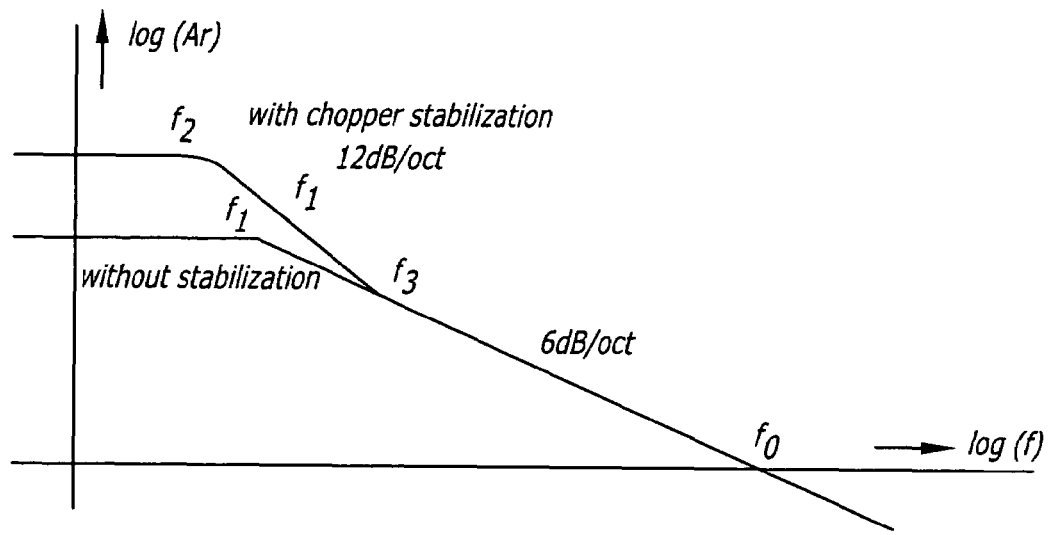
FIG. 13 presents curves illustrating a desired 6 dB/oct roll off in the frequency response of an amplifier and an undesired low frequency bubble in the frequency response in some amplifiers.

The amplifier of FIG. 11 can be combined with the multipath hybrid double-nested Miller compensation structure to obtain a straight 6 dB/oct roll off. To that purpose two capacitors $C_{M51}$ and $C_{M52}$ have been added, as is shown in FIG. 12.

In the case of either opamps or instrumentation amplifiers, autozeroing and offset correction loops may be added in accordance with the copending application set forth above. In that regard, it will be noted that the instrumentation amplifier of FIG. 10 is an extension of the opamp of FIG. 7, and that the instrumentation amplifier of FIG. 12 is an extension of the opamp of FIG. 8.

CONCLUSION

The embodiments of the invention disclosed herein show that it is possible to combine chopper-stabilized and chopper chopper-stabilized OpAmps and instrumentation amplifiers with multipath hybrid nested Miller compensation to provide a good high frequency compensation structure to obtain a desired straight roll off of the frequency characteristic with 6 dB/oct. The exemplary embodiments are described with respect to differential amplifiers, though may be realized as single ended amplifiers also, that is, as single input, single output amplifiers. Also in the embodiments disclosed, two output stages are shown, though in some cases, such as in the case of amplifiers that are lightly loaded, a single stage may be used, dispensing with the use of amplifier $G_2$ and Miller compensation capacitors $CM_{21}$ and $CM_{22}$. This is illustrated for the circuits of FIGS. 7, 8, 10 and 12 in FIGS. 15 through 18, respectively. Also amplifier G5 may be an attenuator, either an amplifier with a gain of less than one, or simply resistors for converting the integrator output to a current for input to the current summing point or for attenuation. Additional Miller compensated, nested amplifiers may also be incorporated as desired. Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. An amplifier circuit having a circuit input and an circuit output, comprising:

first and second amplifiers cascaded together, each having an input and an output, the circuit input being coupled to the input of the first amplifier and the circuit output being coupled to the output of the second amplifier;

a first chopper having an input coupled to the circuit input and an output coupled to an input of a third amplifier, an output of the third amplifier being coupled to an input of a second chopper, the second chopper having an output coupled to a fourth amplifier coupled as an integrator with capacitor feedback, an output of the integrator being coupled to an input of a fifth amplifier or attenuator, an output of the fifth amplifier or attenuator being coupled to combine with the output of the first amplifier as the input coupled to the second amplifier;

one or more first compensation capacitors coupled between the output of the second amplifier and the input of the second amplifier;

one or more second compensation capacitors coupled between the output of the second amplifier and the input to the integrator;

the amplifiers and capacitors being chosen to provide an amplifier circuit frequency response that is flat for low frequencies, and which rolls off at 6 dB per octave above the low frequencies.

2. The amplifier circuit of claim 1 further comprising:

sixth and seventh amplifiers, a third chopper and an attenuator;

the attenuator being coupled to the amplifier circuit output to provide an attenuator output for feeding back to a feedback input;

the feedback input being coupled to inputs of the sixth amplifier and the third chopper, an output of the sixth amplifier being coupled to add to the output of the first amplifier for input to the second amplifier;

an output of the third chopper being coupled to an input of the seventh amplifier, an output of the seventh amplifier being coupled to combine with the output of the third amplifier as the input to the second chopper.

3. An amplifier circuit having a circuit input and an circuit output, comprising:

first, second and third amplifiers cascaded together, each having an input and an output, the circuit input being coupled to the input of the first amplifier and the circuit output being coupled to the output of the third amplifier;

a first chopper having an input coupled to the circuit input and an output coupled to an input of a fourth amplifier, an output of the fourth amplifier being coupled to an input of a second chopper, the second chopper having an output coupled to a fifth amplifier coupled as an integrator with capacitor feedback, an output of the integrator being coupled to an input of a sixth amplifier, an output of the sixth amplifier being coupled to combine with the output of the first amplifier as the input to the second amplifier;

one or more first compensation capacitors coupled between the output of the third amplifier and the input of the third amplifier;

one or more second compensation capacitors coupled between the output of the third amplifier and the input of the second amplifier;

one or more third compensation capacitors coupled between the output of the third amplifier and the input to the integrator;

the amplifiers and capacitors being chosen to provide an amplifier circuit frequency response that is flat for low frequencies, and which rolls off at 6 dB per octave above the low frequencies.

4. The amplifier circuit of claim 3 further comprising:

seventh and eighth amplifiers, a third chopper and an attenuator;

the attenuator being coupled to the amplifier circuit output to provide an attenuator output for feeding back to a feedback input;

the feedback input being coupled to inputs of the seventh amplifier and the third chopper, an output of the seventh amplifier being coupled to add to the output of the first amplifier for input to the second amplifier;

an output of the third chopper being coupled to an input of the eighth amplifier, an output of the eighth amplifier being coupled to combine with the output of the fourth amplifier as the input to the second chopper.

* * * * *

UNITED STATES PATENT AND TRADEMARK OFFICE
CERTIFICATE OF CORRECTION

| | | |
|---|---|---|
| PATENT NO. | : 7,209,000 B2 | Page 1 of 3 |
| APPLICATION NO. | : 11/054580 | |
| DATED | : April 24, 2007 | |
| INVENTOR(S) | : Huijsing et al. | |

It is certified that error appears in the above-identified patent and that said Letters Patent is hereby corrected as shown below:

Please delete Drawing Sheet 3 of 11 and substitute the attached Drawing Sheet 3 of 11.

Please delete Drawing Sheet 11 of 11 and substitute the attached Drawing Sheet 11 of 11.

Signed and Sealed this

Fifteenth Day of April, 2008

JON W. DUDAS
*Director of the United States Patent and Trademark Office*